United States Patent [19]
Yajima et al.

[11] Patent Number: 4,721,198
[45] Date of Patent: Jan. 26, 1988

[54] PROBE CARD CLAMPING AND CHANGING MECHANISM

[75] Inventors: Atsushi Yajima; Katsuyoshi Iguchi, both of Tokyo, Japan

[73] Assignee: Ando Electric Co., Ltd., Tokyo, Japan

[21] Appl. No.: 928,502

[22] Filed: Nov. 7, 1986

[30] Foreign Application Priority Data

Nov. 13, 1985 [JP] Japan ................ 60-254297
Nov. 21, 1985 [JP] Japan ................ 60-179602

[51] Int. Cl.⁴ ............................................ B65G 47/00
[52] U.S. Cl. .............................. 198/345; 198/346.2; 29/1 A
[58] Field of Search ............ 198/345, 346.2, 468.6; 29/1 A; 414/222, 225; 294/119.1; 269/34

[56] References Cited

U.S. PATENT DOCUMENTS

| | | | |
|---|---|---|---|
| 2,352,632 | 7/1944 | Heyman | 294/119.1 |
| 4,492,301 | 1/1985 | Inaba et al. | 198/345 |
| 4,671,401 | 6/1987 | Truninger | 198/468.6 |

FOREIGN PATENT DOCUMENTS 60-1840 1/1985 Japan.

Primary Examiner—Joseph E. Valenza
Attorney, Agent, or Firm—Flynn, Thiel, Boutell & Tanis

[57] ABSTRACT

A probe card clamping and changing mechanism comprising a probe card clamping mechanism and a probe card conveying mechanism. The probe card clamping mechanism comprises a pair of clamping blocks each having a groove for receiving a portion of the periphery of a probe card and two guide holes, a pair of guide members slidably received through the guide holes of the clamping blocks so as to slidably support support the clamping blocks axially slidably for parallel motion with the respective grooves of the clamping blocks facing each other, two pairs of links interconnecting the clamping blocks so that the clamping blocks are moved simultaneoulsy toward and away from each other, an actuator connected to one of the clamping blocks to move the same toward and away from the other, a pair of guide rails for guiding pins pivotally joining two pairs of the links, respectively, so that when the clamping block connected to the actuator is moved by the actuator, the other clamping block is moved accordingly. The probe card conveying mechanism includes a probe card conveying member provided with positioning pins fitting the positioning holes of the probe card and capable of being moved vertically and laterally to convey the probe card to a predetermined position in the probe card clamping mechanism and to remove the probe card from the probe card clamping mechanism.

6 Claims, 4 Drawing Figures

PROBE CARD CLAMPING AND CHANGING MECHANISM

BACKGROUND OF THE INVENTION

1. Field of the Invention:

The present invention relates to a probe card clamping and changing mechanism and, more specifically, to a probe card clamping and changing mechanism comprising a probe card conveying mechanism for conveying a probe card, and a probe card clamping mechanism for clamping a probe card brought to a fixed position by the probe card conveying mechanism.

2. Description of the Prior Art:

A probe card clamping device for an IC testing prober is disclosed in, for example, Japanese Patent Laid-Open Publication No. 60-1840. This probe card clamping device, however, requires troublesome manual operation for replacing a probe card with another every time the type of test IC's is changed.

SUMMARY OF THE INVENTION

It is an object of the present invention to provide a probe card clamping and changing mechanism capable of carrying out automatic probe card clamping and changing operation.

According to the present invention, a probe card having positioning holes is put in place on a probe card conveying member having positioning pins corresponding to the positioning holes of the probe, the probe card is conveyed to a fixed position by a probe card conveying mechanism, and then the probe card is clamped firmly between the clamping blocks of a probe card clamping mechanism so that the probe card is held firmly in place on an IC testing prober.

The above and other objects, features and advantages of the present invention will become more apparent from the following description when taken in conjunction with the accompanying drawings.

DESCRIPTION OF THE PREFERRED EMBODIMENT

Figure 1:
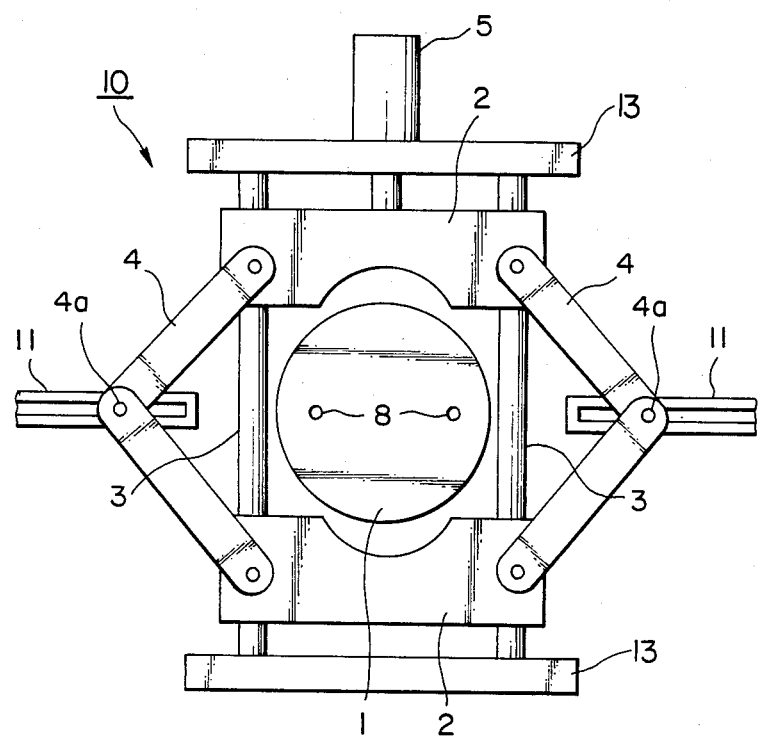
FIG. 1 is a schematic illustration showing the constitution of a probe card clamping and changing mechanism, in a preferred embodiment, according to the present invention, in which the clamping blocks are retracted to release a probe card.
Figure 2:
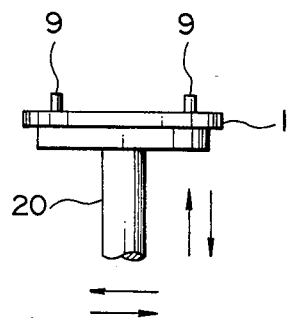
FIG. 2 is a side elevational view of a conveying mechanism on which a probe card is mounted.
Figure 3:
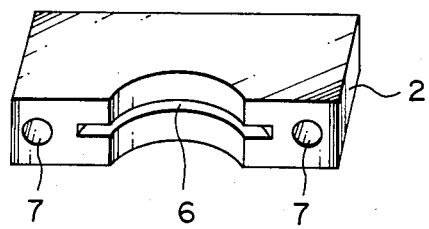
FIG. 3 is a perspective view of one of the clamping blocks of the probe card clamping and changing mechanism of FIG. 1.

FIG. 1 shows a probe card clamping mechanism 10 in a plan view. FIG. 2 shows a probe card conveying member 20 in a side elevation. The probe card clamping mechanism 10 comprises a pair of clamping blocks 2, a pair of guide members 3, a pair of supporting members 13, two pairs of links 4, an actuator 5, and a pair of guide rails 11. As illustrated in FIG. 3, each clamping block 2 has a groove 6 for receiving a portion of the periphery of a probe card 1, and guide holes 7 for receiving the guide members 3 therethrough. The clamping blocks 2 are supported slidably on the guide members 3 with the respective sides having the grooves 6 facing each other. The respective opposite ends of the guide members 3 are fixed to the supporting members 13. One end of one of each pair of links 4 is connected pivotally with a pin 4a to one end of the other link 4, the other end of the former link 4 is connected pivotally to one end of one of the clamping blocks 2, and the other end of the latter link 4 is connected pivotally to one end of the other clamping block 2. Each pair of links are the same in shape and size. The pins 4a are guided by the guide rails 11, repectively, for movement in horizontal directions, as viewed in FIG. 1. The actuator 5 is connected to one of the clamping blocks 2 to move the same toward and away from the other clamping block 2. When the clamping block connected to the actuator 5 is moved toward or away from the other clamping block by the actuator 5, the other clamping block is moved toward or away from the former clamping block by the same distance as the distance of travel of the former clamping block 2. The actuator 5 may be an electric one, a magnetic one, a pneumatic one or a hydraulic one.

In FIG. 1, the clamping blocks 2 are retracted from the clamping position by retracting the upper clamping block, as viewed in FIG. 1, with the actuator 5. In this state, the probe card 1 can be disposed at a predetermined position without being interfered with by the clamping blocks 2.

As illustrated in FIG. 2, the probe card conveying member 20 has positioning pins 9, which are received in the positioning holes 8 of the probe card 1, so that the probe card 1 is mounted correctly on the probe card conveying member 20. The probe card conveying member 20 mounted with the probe card 1 is moved vertically and laterally as indicated by arrows in FIG. 2 by a driving means, such as a pneumatic or hydraulic cylinder, to convey the probe card 1 to a predetermined position in the probe card clamping mechanism 10 and to convey the probe card 1 away from the probe card clamping mechanism 10.

In clamping the probe card 1, the actuator 5 is operated to retract the upper clamping block 2 from the clamping position, and thereby the lower clamping block 2 is also retracted through the links 4 accordingly, so that the clamping blocks 2 are moved away from each other.

Figure 4:
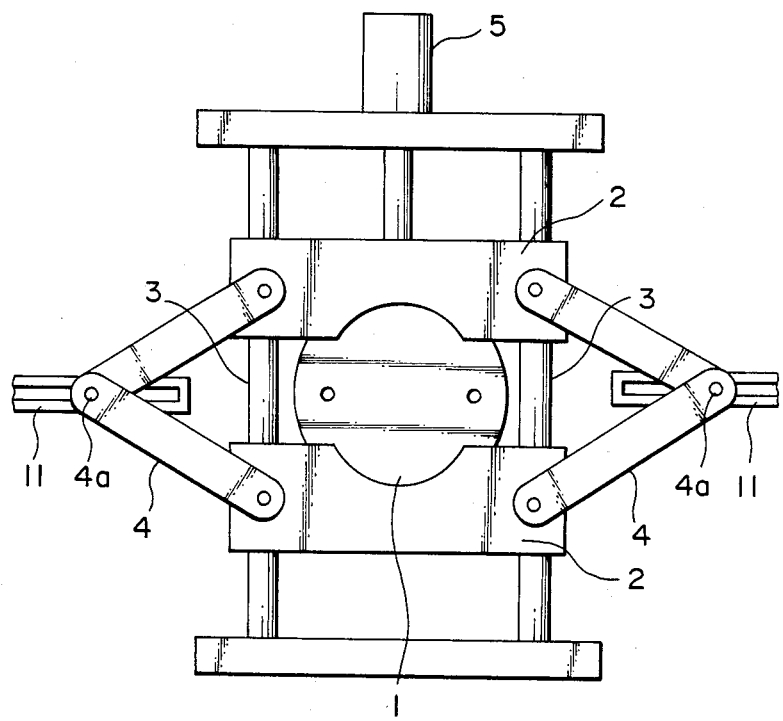
FIG. 4 is a view similar to FIG. 1, in which the clamping blocks are advanced to a probe card clamping position to clamp a probe card.

Then, the probe card conveying member 20 mounted with the probe card 1 with the positioning pin 9 received in the positioning holes 8 of the probe card 1 is moved to a predetermined position in the probe card clamping mechanism 10 to position the probe card 1 correctly between the clamping blocks 2 of the probe card clamping mechanism 10. In positioning the probe card 1, the probe card conveying member 20 is moved, for example, laterally through a space below the clamping blocks 2, and then the probe card conveying member 20 is raised to a position where the probe card 1 is located between the grooves 6 of the clamping members 2. Then, the upper clamping block 2 is advanced toward the probe card 1 by the actuator 5, and thereby the lower clamping block 2 is also advanced through the links 4 toward the probe card 1 accordingly. Finally, the periphery of the probe card 1 is received in the grooves 6 of the clamping blocks 2 and the probe card 1 is clamped between the clamping blocks 2 as illustrated in FIG. 4. Then, the probe card conveying member 20 is lowered, and then the same is moved away from the probe card clamping mechanism 10 leaving the probe card 1 on the probe card clamping mechanism 10.

The same steps of operation of the probe card clamping mechanism 10 and the probe card conveying member 20 are carried out in the reverse sequence to remove the probe card 1 from the probe card clamping mechanism 10.

Thus, the probe card clamping and changing mechanism of the present invention automatically carries out the probe card clamping operation and the probe card removing operation facilitating the automatic replacement of a probe card being used with another one when the type of IC's to be probed is changed.

Although the invention has been described in its preferred form with a certain degree of particularity, it is to be understood that many changes and variations are possible in the invention without departing from the scope and spirit thereof.

What is claimed is:

1. A probe card clamping and changing mechanism comprising:
   (a) a probe card clamping mechanism (10), said probe card clamping mechanism comprising:
   (b) a pair of clamping blocks (2) each having a groove 6 for receiving a portion of the periphery of a probe card (1), and two guide holes (7) formed at the opposite ends thereof, respectively;
   (c) a pair of guide members (3) slidably received through the guide holes (7) of the clamping blocks (2) so as to slidably support the clamping blocks (2) axially slidably for parallel motion with the respective grooves (6) of the clamping blocks (2) facing each other;
   (d) two pairs of links (4), one end of one of each pair of links and one end of the other link being joined pivotally with a pin (4a), the other end of the former link (4) being joined pivotally to one end of one of the clamping blocks (2), the other end of the latter link (4) being joined pivotally to one end of the other clamping block (2);
   (e) an actuator (5) connected to one of the clamping blocks (2) to move the same clamping block (2) toward and away from the other clamping block (2);
   (f) a pair of guide rails (11) for guiding the pins (4a), respectively, for movement perpendicular to the direction of movement of the clamping blocks (2);
   (g) a probe card conveying mechanism including a probe card conveying member (20) provided with positioning pins (9) fitting the positioning holes (8) of the probe card (1), and capable of being moved vertically and laterally relative to the probe card clamping mechanism (10) to convey the probe card (1) to a clamping position in the probe card clamping mechanism (10) and to remove the probe card (1) from the probe card clamping mechanism (10).

2. A probe card clamping and changing mechanism according to claim 1, wherein said links (4) are the same in shape and effective size.

3. A probe card clamping and changing mechanism according to claim 1, wherein said actuator (5) is an electric actuator.

4. A probe card clamping and changing mechanism according to claim 1, wherein said actuator (5) is a magnetic actuator.

5. A probe card clamping and changing mechanism according to claim 1, wherein said actuator (5) is a pneumatic actuator.

6. A probe card clamping and changing mechanism according to claim 1, wherein said actuator (5) is a hydraulic actuator.

* * * * *

UNITED STATES PATENT AND TRADEMARK OFFICE
CERTIFICATE OF CORRECTION

PATENT NO. : 4 721 198

DATED : January 26, 1988

INVENTOR(S) : Atsushi YAJIMA et al

It is certified that error appears in the above-identified patent and that said Letters Patent is hereby corrected as shown below: Title Page In the heading, Item 75; Change Atsushi Yajima; Katsuyoshi Iguchi" to ---Atsushi Yajima; Katsuyoshi Iguchi; Hiroyuki Makishita---.

Signed and Sealed this

Twenty-third Day of August, 1988

Attest:

DONALD J. QUIGG

Attesting Officer

Commissioner of Patents and Trademarks